United States Patent [19]
Ruttan

[11] 3,810,045
[45] May 7, 1974

[54] PUSH-PULL TRANSFERRED-ELECTRON DEVICE CIRCUIT

[75] Inventor: Thomas G. Ruttan, Mountain View, Calif.

[73] Assignee: Varian Associates, Palo Alto, Calif.

[22] Filed: Nov. 3, 1972

[21] Appl. No.: 303,577

[52] U.S. Cl. ................................ 331/96, 331/107 G
[51] Int. Cl. ............................................ H03b 7/14
[58] Field of Search ............... 331/96, 107 G, 107 R

[56] References Cited

UNITED STATES PATENTS

| | | | |
|---|---|---|---|
| 3,702,977 | 11/1972 | Olsson | 331/96 X |
| 3,711,792 | 1/1973 | Kaneko et al. | 331/107 G X |

*Primary Examiner*—Herman Karl Saalbach
*Assistant Examiner*—Siegfried H. Grimm
*Attorney, Agent, or Firm*—Stanley Z. Cole; Harry E. Aine; Robert K. Stoddard

[57] ABSTRACT

A pair of transferred-electron devices, such as Gunn diodes, are spaced apart in a hollow microwave conductor operating in a TE or TM mode. The Gunn devices are coupled in energy exchanging relation to the fields of the operating mode and are spaced apart by approximately an integer number of full wavelengths and in such a manner that the devices are coupled to approximately equal electromagnetic wave energy fields of opposite phase to obtain a push-pull configuration. Output energy is extracted from the operating mode.

9 Claims, 3 Drawing Figures

PATENTED MAY 7 1974 3,810,045

PUSH-PULL TRANSFERRED-ELECTRON DEVICE CIRCUIT

DESCRIPTION OF THE PRIOR ART

Heretofore, transferred-electron devices have been mounted within a coaxial resonator operating in the TEM mode in a push-pull configuration to obtain increased power output compared to circuits wherein the devices are merely paralleled. Examples of such push-pull TEM mode devices are given in an article titled, "Push-pull Operation of Transferred-Electron Oscillators," appearing in Electronics Letters of May 1, 1969, Volume 5, number 9, pages 178–179.

The problem with a coaxial line circuit operating in a TEM mode is that this type of structure has a relatively low Q as contrasted with waveguide or hollow cavity circuits having Q's on the order of 300 to 500 or more. More particularly, a TEM circuit has a typical Q on the order of 50 to 100. High Q circuits have the advantage of lower FM noise, better frequency stability and less load sensitivity.

SUMMARY OF THE PRESENT INVENTION

The principal object of the present invention is the provision of an improved push-pull transferred-electron device circuit.

In one feature of the present invention, a pair of transferred-electron devices, such as Gunn diodes, are mounted within a hollow wave supportive structure operating in a predetermined TE or TM mode with the devices being spaced apart in the structure by approximately an integer number of full wavelengths of the operating mode with the devices coupled to fields 180° out of time phase, whereby a push-pull circuit is obtained for improved efficiency, power output and stability.

In another feature of the present invention, the transferred-electron devices are each coupled in series with a respective conductive post extending into the hollow conductive structure, such posts being provided with RF chokes and electrically insulated from the electrically conductive structure to permit independent DC bias potentials to be applied to the devices via said posts.

In another feature of the present invention, the transferred-electron devices are connected in series with conductive posts protruding into the hollow conductive structure and lossy probes project from the inside wall of the conductive structure into the region of the posts for loading and suppressing certain undesired modes of oscillation associated with the post structures.

Other features and advantages of the present invention will become apparent upon a perusal of the following specification taken in connection with the accompanying drawings herein:

DESCRIPTION OF THE PREFERRED EMBODIMENTS

Figure 1:
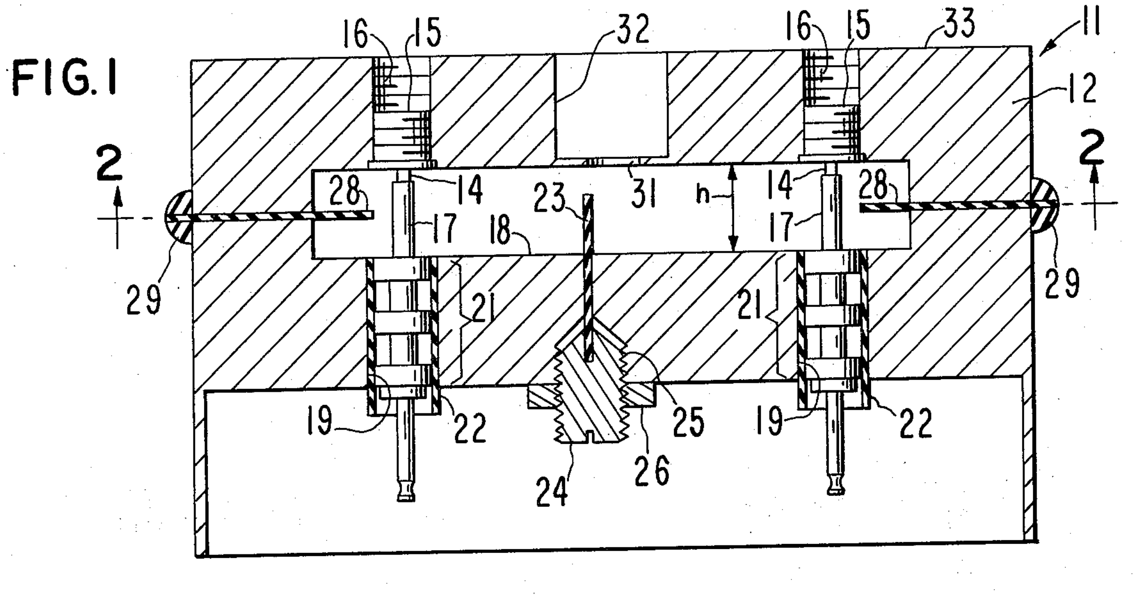
FIG. 1 is a longitudinal sectional view of a KA-band push-pull transferred-electron oscillator circuit incorporating features of the present invention.
Figure 2:
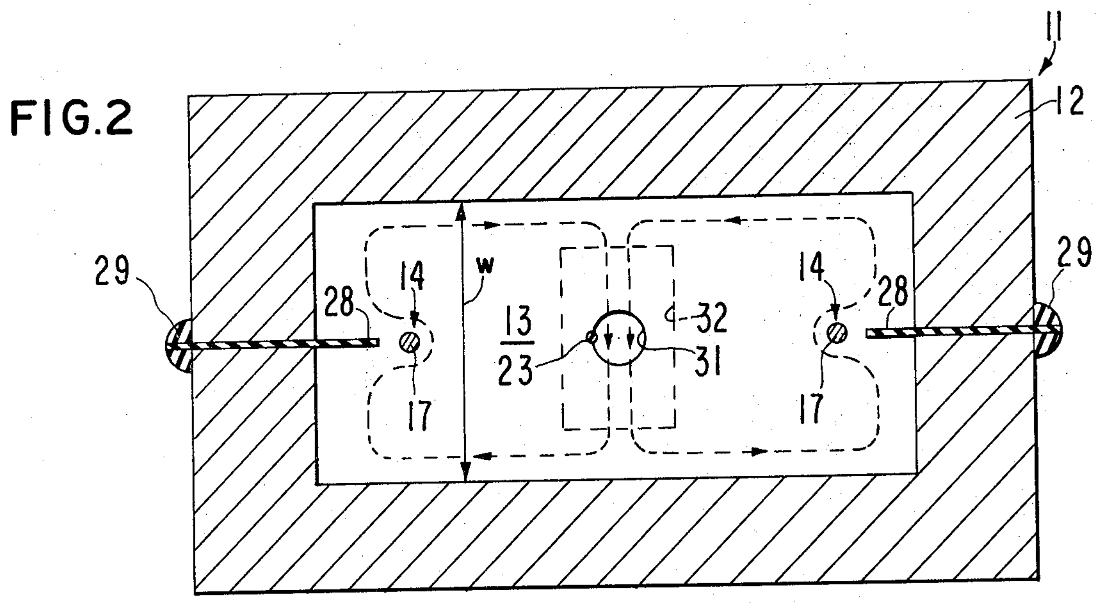
FIG. 2 is a sectional view of the structure of FIG. 1 taken along line 2—2 in the direction of the arrows and, FIG. 3 is a schematic circuit diagram for the oscillator of FIGS. 1 and 2.

Referring now to FIGS. 1 and 2, there is shown a KA-band push-pull transferred-electron oscillator circuit 11 incorporating features of the present invention. The oscillator 11 includes an electrically conductive block body portion 12, as of copper, having an elongated rectangular cavity 13 formed therein to define cavity resonator having a length $l$ a width $w$, and a height $h$.

In a typical example of a KA-band oscillator, operating at a frequency of 42 GHz, the height $h$ of the resonator is approximately 0.060 inches, the width $w$ is approximately 0.230 inches and the length $l$ is approximately 0.500 inches. The inside walls of the cavity 13 are silver plated for increased electrical conductivity. The cavity 13 is dimensioned to allow full wavelength resonance in the $TE_{10}$ mode with the pattern of magnetic field lines as indicated in FIG. 2.

A pair of transferred-electron devices 14, such as Gunn diodes, are positioned within the resonator 13 in energy exchanging relation with the electromagnetic wave energy therein in such a manner that the magnetic field is in opposite time phase at the positions of the pair of Gunn diodes 14 as shown in FIG. 2, such that currents at the operating frequency are caused to flow through the Gunn diodes 14 in opposite time phase. In a typical example, the transferred-electron devices 14 are positioned approximately an integer number of full guide wavelengths apart along the length of the resonator 13 in order for the energies of the two diodes 14 to add when they are in time phase reversal.

The transferred-electron devices 14 are carried upon one end of a flanged electrically and thermally conductive stud portion 15 of a conventional Gunn diode package, such as an N-34 package commercially available from Varian Associates. The stud portion 15 is threaded into a threaded bore 16 in the wall of the conductive block 12. Conductive posts 17 project into the resonator 13 from an opposed broad wall 18 of the block body 12 for making an electrical connection to one terminal of the transferred-electron devices 14 for applying a DC bias potential to the devices 14. More particularly, the posts 17 extend through bores 19 in the block body 12 and each post 17 includes a multiple quarter wave radio frequency choke portion 21 disposed within the bore 19 and supported in insulative relation relative to the bore 19 via the intermediary of a thin dielectric sleeve 22, as of KEL-F which allows an independent DC bias potential, as of 5 volts, to be applied to the Gunn devices 14 via the radio frequency choked posts 17.

A dielectric tuning post 23, as of sapphire, projects into the cavity 13 from a broad wall 18 for tuning the resonant frequency of the resonator 13. In a typical example, the dielectric tuning post 23 has a diameter of 0.035 inches. The sapphire tuning post 23 is fixedly secured to a screw 24 which threadably mates with a threaded bore 25 in the block body 12 for effecting rectilinear translation of the tuner 23 within the resonator 13. A lock nut 26 is threaded over the screw 24 for locking the tuning post 23 in position.

A pair of lossy mode suppression posts 28, as of carbon impregnated epoxy, project through opposite end walls of the resonator 13 into the region adjacent the conductive posts 17 for loading and suppressing certain undesired modes of oscillation associated with the respective posts 17. In a typical example, the mode suppression posts 28 are approximately 0.050 inches in diameter. The posts are adjusted in position relative to the conductive posts 17 to arrive at the smallest turn-on DC bias voltage $V_B$ with reasonable attenuation of the maximum power output mode of the oscillator. When the best position has been determined for each post 28, they are epoxied in place by epoxy cement 29.

An output coupling iris 31 is centrally disposed of one of the broad walls of the resonator 13 for coupling to the magnetic fields of the resonator 13 at a position midway between the devices 14 where the magnetic fields are maximum. This coupling provides a high degree of coupling to the electric field of an undesired mode for loading and suppressing the unwanted mode. A conventional KA-band waveguide 32 is formed in the wall of the conductive block 12 in registration with the coupling iris 3, for transmitting wave energy to a suitable utilization device, such as an antenna or the like. An output coupling flange, not shown, is affixed over face 33 of the block 12.

Figure 3:
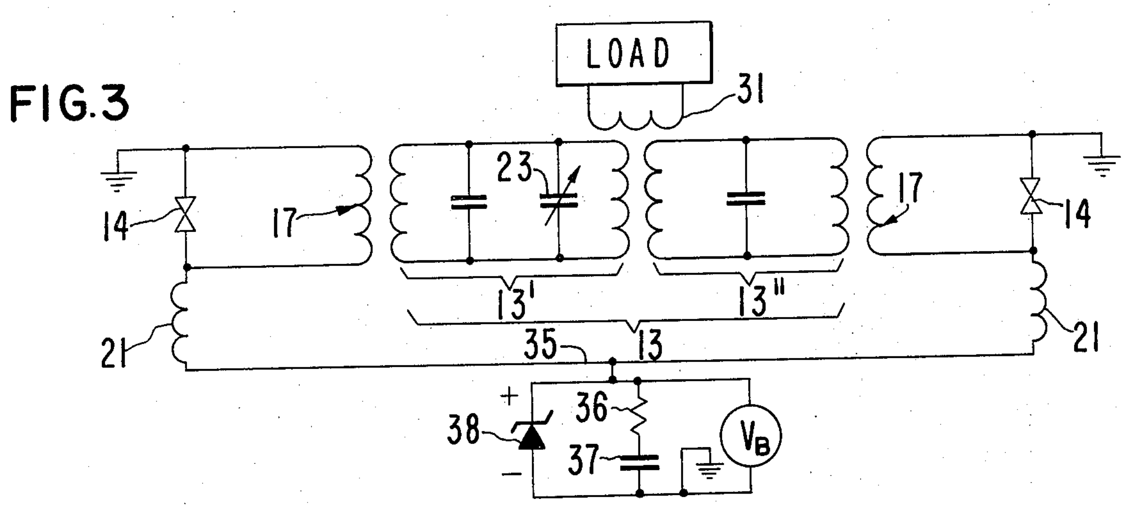

Referring now to FIG. 3 there is shown the equivalent electrical circuit for the oscillator 11 of FIGS. 1 and 2. More particularly, the main resonator cavity 13 appears as two inductively coupled half wavelength resonators 13' and 13 with the transferred-electron devices 14 inductively coupled at opposite ends of the resonator 13 to the fields of the resonator 13 via the inductive transformer posts 17. DC bias potential $V_B$, as of 5 volts, is applied across the transferred-electron devices 14 via the RF choke structures 21 connected in parallel to the source of bias potential $V_B$ via leads 35.

A resistor 36, as of 22 ohms, and a capacitor 37 as of 0.1 microfarads, are connected in series across the source of bias potential $V_B$ to suppress bias oscillations. A Zener diode 38 is connected across the source of bias potential $V_B$ in reverse polarity such that a reverse negative polarity may not be applied across the transferred-electron devices 14. The Zener diode 38 has a breakdown potential of 6.5 volts which is slightly higher than the desired bias potential of 5.0 volts.

A load is connected to the center of the resonator 13 via the inductive iris 31 for coupling output wave energy from the resonator 13 to the load.

In operation, the oscillator 11, in a typical example, provides 260 milliwatts of CW power output at 4 percent efficiency at an operating frequency of 42 GHz. The oscillator 11 has a tuning range of plus or minus 100 MHz about the center frequency. The oscillator 11, with suitable scaling of dimensions, provides an operable oscillator from C band to V band.

What is claimed is:

1. In a push-pull transferred-electron device circuit:

means for defining a hollow electrical conductor for supporting electromagnetic wave energy therein in a predetermined TE or TM mode at a predetermined operating wavelength;

a pair of transferred-electron devices disposed in said hollow conductor and coupled in energy exchanging relation to the fields of said predetermined operating mode, said pair of transferred-electron devices being spaced apart in said hollow conductor by approximately an integer number of full wavelengths of said predetermined operating mode, said pair of devices being coupled to approximately equal electromagnetic fields of opposite time phase of said operating mode such that the energies of said wavelength spaced devices adds in phase in said operating mode, and an output coupling means for coupling wave energy from said operating mode to a utilization circuit.

2. The apparatus of claim 1 wherein said means for defining said hollow conductor comprises a cavity resonator.

3. The apparatus of claim 2 wherein said cavity resonator has a characteristic height, width, and length, and wherein the height is less than both the width and length, and wherein said output coupling means is disposed at a point intermediate said pair of transferred-electron devices and approximately an integer number of half wavelengths of said predetermined operating mode from one of said transferred-electron devices in a direction along the length of said cavity resonator.

4. The apparatus of claim 1 including, a pair of electrically conductive posts projecting into said hollow conductor in a direction generally perpendicular to the direction of the magnetic field vector of said predetermined operating mode of electro-magnetic wave energy in the vicinity of said post, and wherein each of said transferred-electron devices is interposed in the region between the inner ends of said posts and an opposed inside wall of said hollow conductor.

5. The apparatus of claim 4 including, lossy mode suppression members projecting into the interior of said hollow conductor in the region thereof adjacent said pair of posts for suppression of certain unwanted modes of oscillation within said hollow conductor.

6. The apparatus of claim 4 including, means for electrically insulatively supporting said posts from said hollow conductor for DC potential, radio frequency choke means associated with each of said posts for providing a radio frequency short between said posts and said hollow conductor while permitting independent DC bias potentials to be applied to said transferred-electron devices via said posts.

7. The apparatus of claim 5 wherein said lossy mode suppression members are lossy rods.

8. The apparatus of claim 2 including, means for tuning said cavity resonator.

9. The apparatus of claim 6 including, means for connecting said pair of transferred-electron devices in parallel with each other and in series with a source of DC bias potential.

* * * * *